US010417548B2

(12) United States Patent
Mathieu et al.

(10) Patent No.: US 10,417,548 B2
(45) Date of Patent: Sep. 17, 2019

(54) METHOD FOR PRODUCING A CIRCUIT FOR A CHIP CARD MODULE AND CIRCUIT FOR A CHIP CARD MODULE

(71) Applicant: Linxens Holding, Mantes la Jolie (FR)

(72) Inventors: Christophe Mathieu, Mantes la Jolie (FR); Bertrand Hoveman, Eragny-sur-oise (FR)

(73) Assignee: Linxens Holding, Mantes la Jolie (FR)

( * ) Notice: Subject to any disclaimer, the term of this patent is extended or adjusted under 35 U.S.C. 154(b) by 0 days.

(21) Appl. No.: 15/309,904

(22) PCT Filed: May 13, 2015

(86) PCT No.: PCT/FR2015/051254
§ 371 (c)(1),
(2) Date: Nov. 9, 2016

(87) PCT Pub. No.: WO2015/173514
PCT Pub. Date: Nov. 19, 2015

(65) Prior Publication Data
US 2017/0270398 A1    Sep. 21, 2017

(30) Foreign Application Priority Data
May 14, 2014 (FR) ..................... 14 54287

(51) Int. Cl.
*G06K 19/077* (2006.01)
(52) U.S. Cl.
CPC . *G06K 19/07722* (2013.01); *G06K 19/07733* (2013.01); *G06K 19/07754* (2013.01); *H01L 2224/48228* (2013.01)

(58) Field of Classification Search
CPC ....... G06K 19/07722; G06K 19/07733; G06K 19/07754
USPC .......................... 235/487, 488, 492
See application file for complete search history.

(56) References Cited

U.S. PATENT DOCUMENTS

| | | | | |
|---|---|---|---|---|
| 5,598,032 A | * | 1/1997 | Fidalgo ............ | G06K 19/07747 235/492 |
| 6,200,829 B1 | * | 3/2001 | Miller .............. | G06K 19/07745 257/E21.509 |
| 2006/0139901 A1 | * | 6/2006 | Meireles .......... | G06K 19/07745 361/760 |
| 2013/0062419 A1 | * | 3/2013 | Finn ................. | G06K 19/07718 235/492 |

(Continued)

FOREIGN PATENT DOCUMENTS

EP   0 671 705 B1   9/1995
EP   0 676 716 A1   10/1995
(Continued)

*Primary Examiner* — Paultep Savusdiphol
(74) *Attorney, Agent, or Firm* — Harrington & Smith

(57) ABSTRACT

The invention concerns a method for producing a flexible circuit for a chip card module. The invention consists of using conductive pads located on the same face of the module as the contacts intended to establish a connection with a card reader, in order to produce an electrical connection between an antenna and an electronic chip. The connections with conductive pads are located partly inside an encapsulation area and partly outside said encapsulation area and respectively to either side of same. The invention also relates to a flexible circuit for implementing this method.

23 Claims, 4 Drawing Sheets

(56) References Cited

U.S. PATENT DOCUMENTS

2015/0294213 A1* 10/2015 Ziemkus .......... G06K 19/07754
 235/492

FOREIGN PATENT DOCUMENTS

| | | |
|---|---|---|
| EP | 1 816 593 A1 | 8/2007 |
| EP | 1 887 494 A1 | 2/2008 |
| EP | 2 579 187 A1 | 4/2013 |
| FR | 2 810 768 A1 | 12/2001 |
| FR | 2 880 160 A1 | 6/2006 |

* cited by examiner

METHOD FOR PRODUCING A CIRCUIT FOR A CHIP CARD MODULE AND CIRCUIT FOR A CHIP CARD MODULE

The invention relates to the field of chip cards. Chip cards are well known to the public, for which they have multiple uses: payment cards, SIM cards for cell phones, transport cards, identity cards, etc.

Chip cards comprise transmission means for transmitting data from the chip to a card reader device (reading) or from this device to the card (writing). These transmission means may be "contact", "contactless" or else with a dual interface where they combine the two preceding means. The invention particularly relates to the field of dual-interface chip cards. Dual-interface chip cards are called "dual" if the "contact" and "contactless" modes are managed by a single chip or "hybrid" if the "contact" and "contactless" modes are managed by two, physically separate, chips.

Dual-interface chip cards are generally composed of a rigid support made of a plastic material of PVC, PVC/ABS, PET or polycarbonate type forming the body of the card, in which a separately produced electronic module and antenna are incorporated. The electronic module comprises a generally flexible printed circuit board that is equipped with an electronic chip (integrated circuit) and contact lands that are electrically connected to the chip and flush with the electronic module, on the support surface, for a connection by electrical contact with a card reader device. Dual-interface chip cards furthermore comprise at least one antenna for transmitting data between the chip and a radiofrequency system that allows contactless reading/writing of data.

In the prior art, it has often been proposed to connect the antenna to conductive lands implemented on the side that is opposite that comprising the contacts. Stated otherwise, the electronic module to be inserted into a card is called a "double-sided" circuit board, with one conductive side with the contacts and one conductive side with the conductive lands of the antenna, these two conductive sides each being respectively positioned on one side of an insulating substrate.

One aim of the invention is to design modules for "dual" cards that are more cost-effective to produce.

To this end, a method for producing a flexible circuit for a chip card module is presented in which an insulating substrate and a single conductive layer supported by this insulating substrate are provided. The contacts are implemented in this conductive layer. The implementation of the contacts may be carried out by etching a sheet of electrically conductive material, such as a copper alloy, that was previously bonded to and/or laminated onto the insulating substrate, with or without a layer of adhesive between the insulating substrate and the conductive layer. Alternatively, the implementation of the contacts may be carried out by "leadframing" the contacts in a sheet of electrically conductive material, such as a copper alloy, prior to its bonding to and/or lamination onto the insulating substrate (also with or without a layer of adhesive between the insulating substrate and the conductive layer).

According to this method, the insulating substrate is perforated in order to form connection wells. In the case in which the contacts are etched into the conductive layer after the latter has been transferred onto one of the sides of the substrate, this perforation step is advantageously carried out by punching the insulating substrate before the latter accepts the conductive layer.

In any case, the conductive layer is therefore ultimately supported by the insulating substrate, with a first side turned toward the insulating substrate and a second side intended to establish a connection by electrical contact with a chip card reader.

Furthermore, the conductive layer at least partially covers connection wells, the first side of the former being intended to establish, at the level of connection wells, an electrical connection with an electronic chip. Generally, the conductive layer completely covers the connection wells in order to form blind holes. However, it may in particular occur that a micro-hole is made in the conductive layer at the level of the area covering a connection well.

At least two conductive lands, that are electrically isolated from the contacts, are also made in the conductive layer, at the level of which lands the first side of the conductive layer at least partially closes up at least one connection well that is intended to connect an electronic chip to an antenna.

The flexible circuit for a chip card module thus produced therefore comprises only one conductive side and allows a layer of conductive material on the other side of the insulating substrate to be saved. Nevertheless, by virtue of the conductive lands that are separate and electrically isolated from the contacts intended to connect to a card reader, it is possible to connect a chip to an antenna through the connection wells.

For example, five contacts are made in the conductive layer, each respectively for connecting the ground, the power supply, the input/output, the clock and the reset of an electronic chip, as well as two additional conductive lands. The two additional conductive lands then each respectively serve to connect one end (or terminal) of an antenna.

The method according to the invention is particularly advantageous when the aim is to miniaturize the modules and/or its conductive lands, and especially when the number of contacts connected to the chip may be reduced. By virtue of the method according to the invention, the dimensions and orientation of the various conductive lands and contacts in a chip card module may be optimized. Thus, for example, two conductive lands are made, each respectively essentially on either side of a central area that is intended to accommodate the electronic chip. As the contacts may, in certain cases, be arranged and distributed in two rows that are each respectively located on either side of a central area that is intended to accommodate the electronic chip, two areas between these two rows may remain in order to form a conductive land on each one thereof. We have then the two conductive lands, each respectively essentially located on either side of the central area that is intended to accommodate the electronic chip, with the two conductive lands and the central area that is intended to accommodate the electronic chip being distributed in a row that is located between the rows of contacts. This arrangement is particularly advantageous, because in a rectangular chip card, the module may be oriented so that the two rows of contacts, each respectively essentially positioned on either side of the chip, are perpendicular to the largest dimension of the card. Each of the ends of the antenna may then arrive at the level of an edge of the module and its cavity, essentially perpendicular to the smallest side of the card. As a space must nevertheless be left between these ends for the chip and its encapsulation resin, a connection well intended for the connection of the electronic chip to the antenna is made at the level of each of the two conductive lands, in such a way that the distance between the wells is greater than the size of the cavity made in the card in order to accommodate the electronic chip and its encapsulation resin.

There exist multiple ways to connect the chip to the antenna. For each conductive land at least two connection wells may be made, i.e. two connection wells separated by a portion of insulating substrate. On each conductive land, one of the connection wells is used for an electrical connection to the electronic chip, and the other for an electrical connection to the antenna. A single well may also be made, of sufficient size along a plane that is parallel to the first and second sides of the conductive layer (it is oblong, for example) in order to electrically connect the electronic chip and the antenna in two places on the same conductive land. Advantageously, the connection to the electronic chip is made (through a well that may or may not be dedicated solely to this connection) in an encapsulation area that corresponds to an area intended to be covered by a material for protecting the chip and its connections to the contacts and to the conductive lands. Specifically, in the finished chip card module, the chip is placed on the side of the substrate that is opposite that on which the conductive layer is located or in a lead frame made in the substrate, and the chip and its connections are encapsulated in a resin ("globe top" or "dam and fill", corresponding to UV or thermal encapsulation). The connection of each conductive land to the antenna may be made after this encapsulation step. It is then carried out outside the encapsulation area through a well that may or may not be dedicated solely to this connection.

Steps of the method according to the invention may be carried out by one and the same producer or by different manufacturers. For example, the electronic chip may be attached to a circuit for a chip card module comprising the insulating substrate and the conductive layer, then connected through the connection wells, both to the contacts and to the conductive lands, by a different manufacturer to that which produced the circuit for a chip card module (without the chip and its connections). The connection of an antenna to a circuit for a chip card module supporting a chip (that is potentially already encapsulated in a protective resin) may potentially be carried out by yet another manufacturer. However, it will be understood that in any case, it is essential that the circuit (referred to as "single side") for a chip card module is suitable for connecting the chip to the antenna via the conductive layer that is located on the side called the "front side" or the "contact side" of the module. For this, as pointed out above, it must comprise at least two conductive lands, that are electrically isolated from the contacts, at the level of which lands the first side of the conductive layer at least partially closes up at least one connection well that is intended to connect an electronic chip to an antenna.

In order to facilitate the operations to integrate the module in a chip card, provision may be made for the insulating substrate to be essentially composed of a thermally non-reactivatable adhesive material. The material is considered to be adhesive by the fact that it adheres to the support to which it is applied (by coating if it is in liquid form or by lamination if it is in the form of a film). Provision may also be made for the insulating substrate to be essentially composed of a thermally reactivatable ("hot-melt") adhesive material. In this case, it is also adhesive by the fact that even after coating and drying, its adhesive properties may be reactivated by heating. The glass transition temperature Tg of the thermally non-reactivatable adhesive material is preferably lower than 100° C. It has, for example, a glass transition temperature Tg of the order of 50° C. (or more generally between 40° C. and 60° C.). The adhesive material is, for example, an epoxy modified by a thermoplastic (of polyamide type for example).

If the adhesive material is to be applied by coating, its viscosity is suitable for it to be able to be spread at ambient temperature onto the electrically conductive layer or a removable intermediate substrate. For example, its viscosity in the solvent phase is of the order of 80 mPa·s (more generally between 60 and 100 mPa·s).

The connection of the antenna to the conductive lands, through the connection wells, may be carried out in multiple ways: using a conductive ink or paste that fills the connection wells and potentially forms a bump above the connection wells with respect to the surface of the side of the substrate opposite the contact side, using a conductive ink or paste that forms a bump on the ends of the antenna to establish a connection at the bottom of the connection wells, using conductive wires (gold) that pass through the connection wells, etc. A (potentially adhesive) substrate may also be used that has anisotropic electrical properties: electrically insulating along one plane and conductive perpendicular to this plane.

In certain cases, in particular when it is necessary to reinforce the fixation and/or the connection of the ends of the antenna to the conductive lands, more than two connection wells are made at the level of at least one conductive land. For example, the connection wells may form a substantially regular array of holes (grid pattern, holes arranged in concentric circles, in a rosette, etc.). The conductive paste, glue or ink then forms a mechanical anchorage and an electrical link with the conductive lands while enclosing the portions of substrate left between the holes.

These multiple connection wells also allow the spread and distribution of the substantially liquid conductive material (paste, ink or glue) to be better controlled.

According to another aspect, the invention relates to a flexible circuit for implementing a method for producing a chip card module (or for producing a complete chip card) in which conductive lands are used that are located on the same side of the module as the contacts that are intended to establish a connection with a card reader, in order to make an electrical connection between an antenna and an electronic chip.

Thus, this flexible circuit comprises an insulating substrate whose thickness, suppleness and flexibility are compatible with, on the one hand, its implementation in a reel-to-reel fabrication method and, on the other hand, with the norms and standards that determine the maximum thickness of finished chip cards. This substrate is in the form of a sheet having first and second main sides that are essentially parallel to one another. This dielectric substrate is generally thin. Its thickness, advantageously less than 400 μm, is for example of the order of 20 to 200 μm, or even between 50 and 150 μm. This substrate is, for example, a flexible film of plastic material (polyimide, PET, PEN, PVC, etc.) or of composite material (glass-epoxy). It may also be composed of a single layer of adhesive whose adhesive properties are potentially thermally reactivatable (at a temperature of between 130° C. and 200° C.). This, potentially adhesive, insulating material may also have anisotropic conductive properties.

The insulating substrate comprises connection wells that pass through the entirety of its thickness in order to be able to establish a connection with a chip located on the side called the "back" or "bonding" side and contacts and conductive lands, that are electrically isolated from the contacts, that are located on the side called the "front" or "contact" side.

The insulating substrate therefore comprises a conductive layer supported by the insulating substrate, with a first side turned toward the insulating substrate and a second side. The contacts and conductive lands are formed in this conductive layer.

At the level of the contacts, the second side of the conductive layer is intended to establish a connection by electrical contact with a chip card reader. The first side of the conductive layer is intended to establish, at the level of connection wells, an electrical connection with an electronic chip.

At the level of the conductive lands, the first side of the conductive layer at least partially closes up at least one connection well that is intended to connect an electronic chip to an antenna.

With this circuit, a chip card module may be implemented that therefore comprises contacts conforming to the standard for chip cards and conductive lands for connecting to an antenna. This module then comprises first blind holes (connection wells that are at least partially closed up by contacts) for connecting the chip to the contacts and second blind holes (connection wells that are at least partially closed up by conductive lands) for connecting the chip to the antenna. The connection of the antenna (in the card) to the module may be made either by third blind holes (connection wells that are at least partially closed up by conductive lands) that are separate from the second blind holes, or by the same second blind holes as those that serve to connect the chip to the conductive lands, or directly through a substrate that is electrically conductive along its thickness and electrically insulating along a plane perpendicular to this thickness.

The mechanical fixation of the electronic chip to the substrate is carried out by at least one known technique, such as die attach, and its electrical connection to the contacts and to the antenna is carried out by at least one known technique, such as flip-chip technology, wire bonding, etc.

Other features and advantages of the invention will become apparent upon reading the detailed description and the appended drawings in which.

Figure 2:
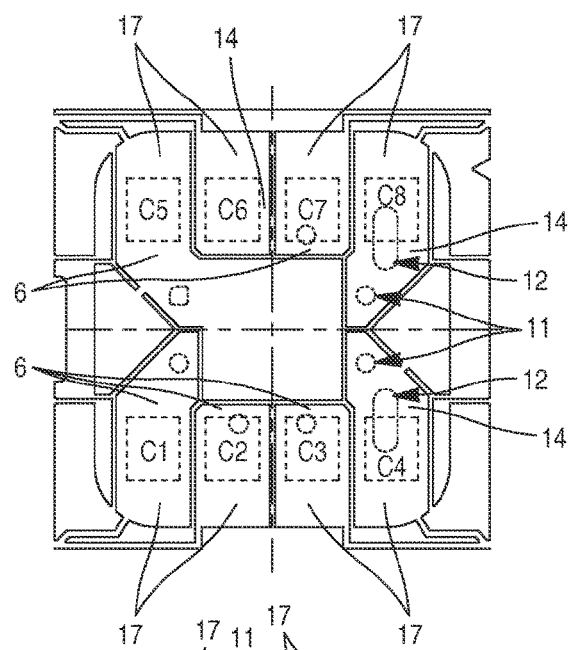
FIG. 2 is a diagrammatic representation, viewed from its front side, of a circuit with contacts, this circuit being intended to implement a module for a card such as that shown in FIG. 1.
Figure 3:
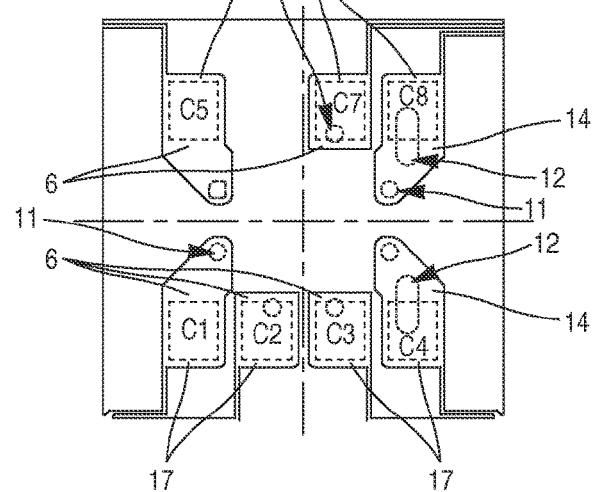
FIG. 3 shows, in an analogous manner to FIG. 2, one variant of the circuit of FIG. 2.
Figure 4:
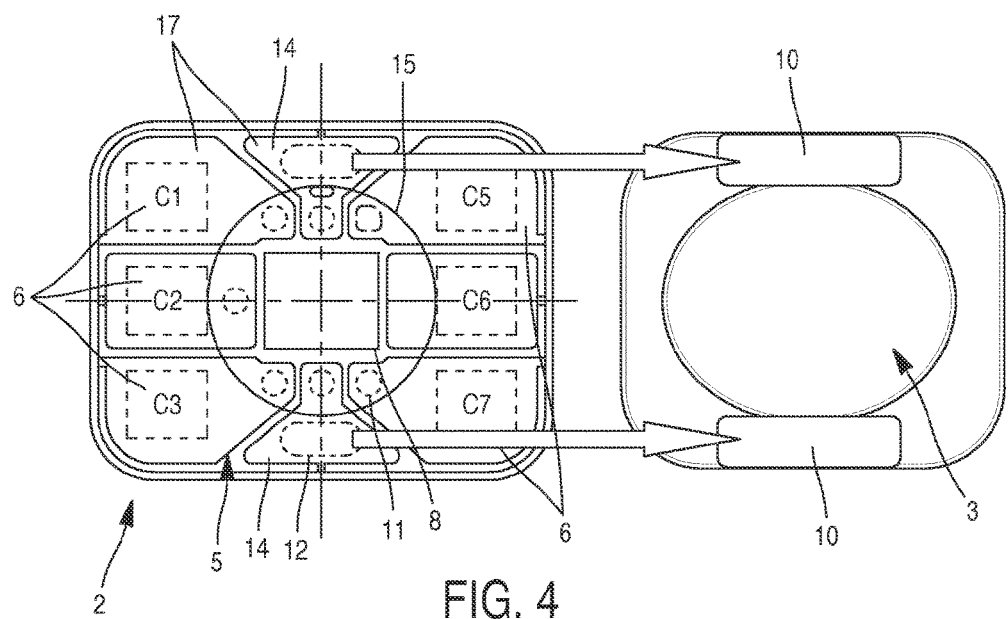
FIG. 4 shows, in an analogous manner to FIG. 2, one variant of the circuits of FIGS. 2 and 3 and its integration in a chip card cavity.
Figure 6:
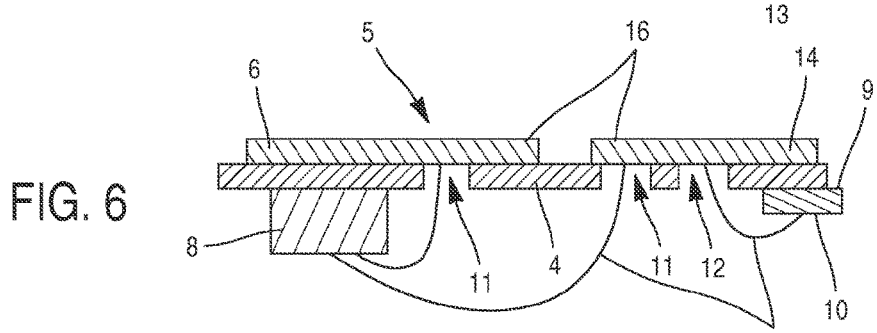
Figure 7:
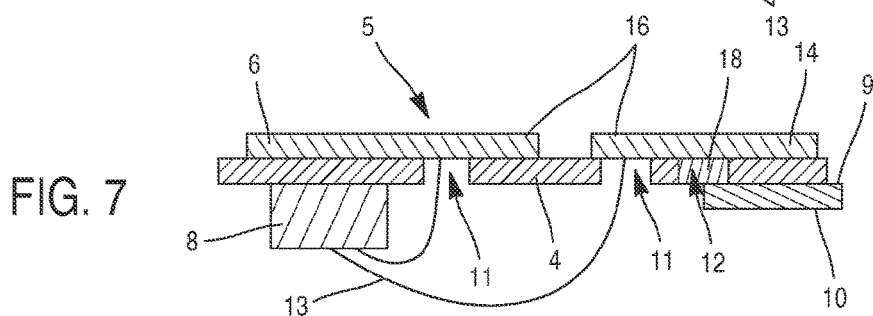
Figure 8A:
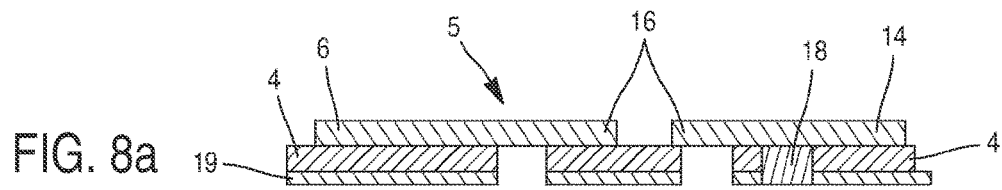
Figure 8B:
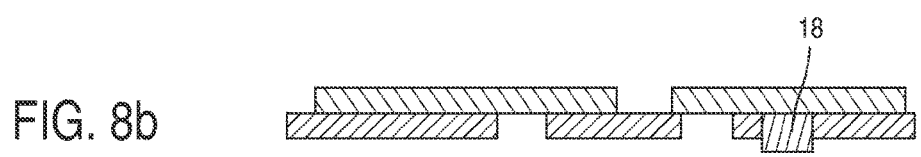
Figure 8C:
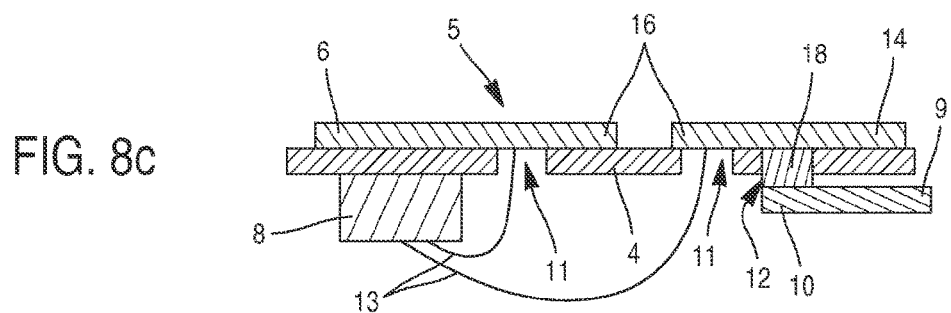

FIGS. 5, 6, 7, 8 (a, b, c), 9, 10, 11 and 12 are diagrammatic representations in cross section of various exemplary embodiments of a circuit such as that of FIGS. 2 to 4, with its connections to a chip and to an antenna, FIGS. 8a and 8b illustrating steps that result in the structure shown in FIG. 8c.

In this text, "conductive area 17" refers to an area (positioned according to ISO Standard 7816-2 and also called "contact" 6 in this text) of the conductive layer 16 that may be intended for the connection, by contact, between the chip 8 and a card reader, or else an area (also called conductive land 14) of the conductive layer 16 that may be intended for connecting, according to the invention, the chip to an antenna. The conductive lands 14 therefore correspond to conductive areas 17 that are similar to the contacts 6, but which are not connected to a chip 8 for communication, by contact, with a card reader. They may therefore be used for connecting to an antenna.

Figure 1:
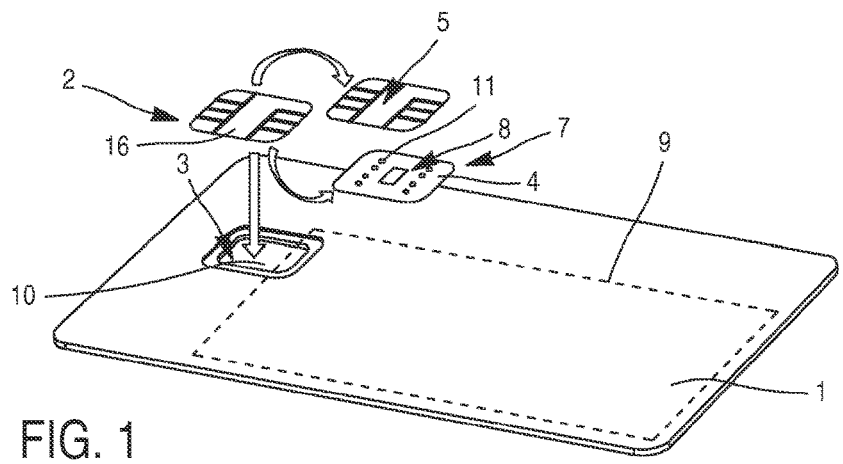
FIG. 1 is a diagrammatic representation in perspective of a chip card intended to accommodate a circuit for a chip card according to the invention.

As shown in FIG. 1, the invention may be used for the implementation of a chip card 1 (of bank card or another type). This card 1 comprises a module 2 that is intended to be inserted in a cavity 3, for example milled into the body of the card 1. This module 2 comprises an electrically insulating substrate 4 that is advantageously flexible. On one of the sides of this substrate 4, called the front side 5, conductive areas (i.e. contacts and conductive lands) that are electrically isolated from one another are made in a conductive layer 16.

On the other side, called the back side 7, the substrate 4 supports a chip 8. The substrate 4, along with the contacts 6 and the conductive lands, constitutes a metalized flexible circuit.

The conductive layer 16 is therefore supported by the substrate 4, with a first side turned toward the substrate 4 and a second side intended to establish a connection by electrical contact with a chip card reader (not shown).

An antenna 9 (of Class 1 or Class 2 size according to ISO Standard 14443-1, for example), is inserted into the body of the card 1, between two laminated layers. The ends 10 of this antenna 9 are accessible in the cavity 3, after the milling thereof, for connecting to the chip 8.

The contacts are connected to the chip 8 by wires (not visible in FIG. 1, but shown in FIGS. 5 to 11) through connection wells 11 made in the substrate 4. These connection wells 11 are, for example, made by perforating the substrate 4, before laminating the conductive layer 16 onto the substrate 4. The conductive layer 16 at least partially covers the connection wells 11, the first side of the conductive layer 16 therefore forming the bottom of these connection wells. The connection wells 11 then form blind holes and allow access to the front side 5 from the back side 7, with a single conductive layer 16 on the front side 5.

The conductive layer 16 may accept, on its first and/or its second side(s), various layers of metallization (nickel, gold, etc.). The quality of the first (generally metalized) side of the conductive layer 16 is important in order to ensure a good connection to the chip, for example by soldering conductive wires 13.

As shown diagrammatically in FIG. 2, the conductive areas 17 (whose dimensions and position are defined by ISO Standard 7816-2) are, for example, eight in number (C1, C2, C3, C4, C5, C6, C7 and C8). The simple rectangular shapes and dotted lines around the references C1 to C8 represent the minimum dimensions and the positions of the conductive areas C1 to C8 according to ISO Standard 7816-2. The conductive areas C1, C2, C3, C5 and C7 are always used as contacts for a connection between the chip 8 and a card reader device. Aside from NFC applications, the conductive area C6 is not used and aside from USB applications, the conductive areas C4 and C8 are not used for dual-interface bank card applications. The conductive lands 14 corresponding to the contacts C6, C4 and C8 are not, in these cases, used for establishing an electrical connection between the chip 8 and a card reader. The conductive lands C4 and C8 may therefore serve, according to the invention, to connect the antenna 9. Specifically, while making the blind holes 12 (which may be likened to the connection wells 11, but, for example, larger, oblong, etc.) through the substrate 4, it is possible to use two conductive lands (C4 and C8, in this example) to connect the antenna 9 to the chip 8.

Various ways to achieve this connection are presented below in conjunction with FIGS. 5 to 11.

According to one variant shown in FIG. 3, the conductive areas 17 are seven in number, of which five are contacts 6 in the strict sense and two are conductive lands 14. The surface area of the conductive area C5 is considerably reduced, the conductive area C6 is removed and, more generally, the metalized conductive surfaces for implementing the contacts 6 and the conductive lands 14 are minimized in order to cover, on the one hand, essentially the minimum surface areas required by ISO Standard 7816-2 for the conductive areas C1, C2, C3, C4, C5, C7 and C8 and, on the other hand, the connection wells 11 and blind holes 12. It may be noted that the connection wells 11 and the blind holes 12 occupy the same positions as in the preceding example.

According to yet another variant shown in FIG. 4, the conductive areas 17 are eight in number, of which five are contacts 6 in the strict sense (C1, C2, C3, C5 and C7), and two are conductive lands 14 for connecting the antenna and the conductive area C6 which remains unused, except for aesthetic purposes. The connection wells 11 and the oblong holes 12 are shown in dotted lines, allowing the contacts 6 and the conductive lands 14 to be connected (schematically shown by the solid lines between the connection wells 11 and the chip 8) to the chip 8 (on the back face) through the substrate, by virtue of connection wires 13. The circle corresponding to the encapsulation area 15 of the chip 8 and its connection wires 13 leaves the oblong holes 12 free so that they can subsequently be connected to an antenna 9. Indeed, as shown on the right of FIG. 4, the ends 10 of the antenna are uncovered during the milling of the cavity 3. During the insertion of the module 2 into the cavity 3, the conductive lands 14 come to face the ends 10 (as shown by the arrows) in order to be connected thereto.

This configuration is particularly advantageous from the point of view of miniaturization, as well as orientation with respect to the antenna.

Specifically, as the two conductive lands 14 are each essentially respectively implemented on either side of a central area that is intended to accommodate the electronic chip 8, the bulk of the module in terms of width is essentially limited to that of three contacts 6 arranged and distributed in a row. We therefore have two rows of three contacts 6 that are each respectively located on either side of a central area that is intended to accommodate the electronic chip 8. Two areas remain between these two rows, on either side of this central area, which may be used to form the conductive lands 14. These conductive lands 14 face the ends 10 of the antenna, on either side of the cavity 3.

The connection of the conductive lands to an antenna 9 may be achieved in numerous ways.

Figure 5:
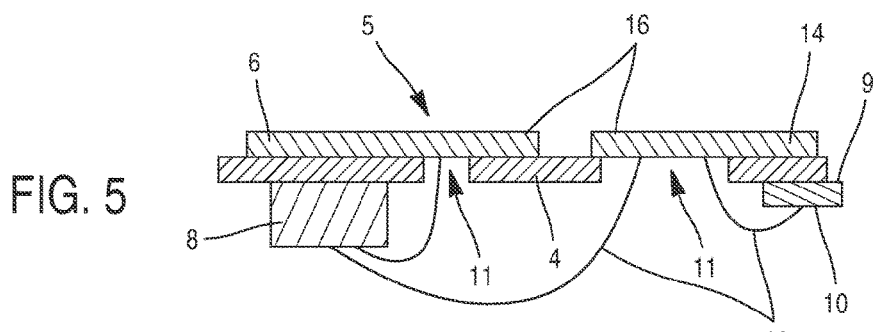

FIG. 5 shows, in cross section, a substrate 4 with a conductive layer 16 in which contacts 6 and conductive lands 14 have been made. A chip 8 is fixed to the side of the substrate that is opposite that on which the conductive layer 16 rests. Connection wells 11 allow the chip 8 to be connected to the first side of the conductive layer 16 by virtue of connection wires 13 of gold or copper type. In this exemplary embodiment, the ends 10 of the antenna 9 are also connected to the first side of the conductive layer 16 by virtue of connection wires 13. In this case, one antenna end 10 and the chip 8 are connected to a conductive land 14 through one and the same connection well 11 that is potentially enlarged with respect to those required for connecting the chip 8 to a contact 6.

According to the variant illustrated by FIG. 6, one antenna 9 end 10 and the chip 8 are connected to a conductive land 14 through two separate holes (a round connection well 11 and an oblong blind hole 12, for example) that are separated by a portion of substrate 4.

According to the variant illustrated by FIG. 7, the wired connection of the end 10 of the antenna 9 to the conductive land 14 is replaced by a charged conductive paste, glue or ink 18. The conductive paste is, for example, a solder paste comprising a binary or ternary metal alloy such as AgSn, AgSnBi or AgSnCu. The conductive glue and ink are charged with conductive metal particles such as silver or copper.

According to the variant illustrated by FIGS. 8a to 8c, a support film 19 for protecting the substrate 4 (required in particular in the case of a hot-melt adhesive substrate 4) is used to form a bump of conductive paste 18 (FIG. 8a) of, for example, between 50 and 100 µm. The protective film 19 is subsequently removed, for example just before the module is inserted into the card, thereby leaving the conductive paste 18 as a bump (FIG. 8b) in order to facilitate the connection to one antenna 9 end 10 when the module is integrated in the card (FIG. 8c). The other elements of the module remain, for example, essentially the same as those of the variants presented above.

Figure 9:
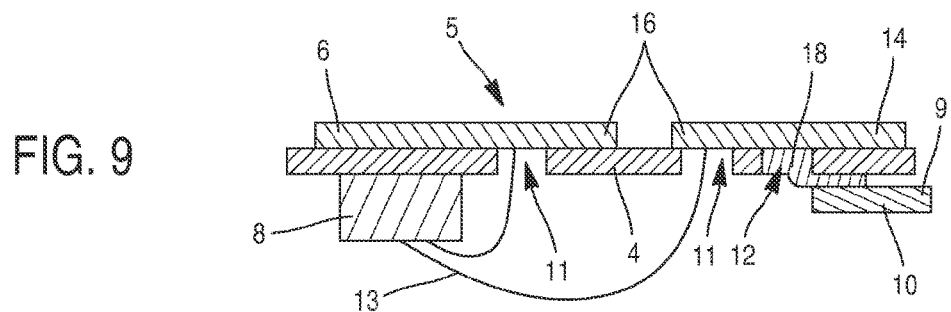

According to the variant illustrated by FIG. 9, the conductive paste 18 is made to overflow from the blind hole 12 on the back side of the substrate 4 in such a way as to form, once again, a bump that will facilitate the connection to an antenna 9 end 10 during the integration of the module in a card.

Figure 10:
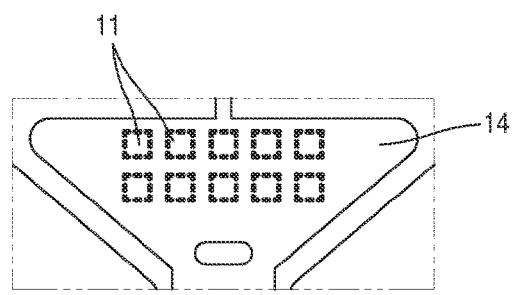

FIG. 10 is a diagrammatic representation, viewed from above, of a conductive land 14 such as that of the embodiment illustrated by FIG. 4. The fixation and the connection of the ends of the antenna to the conductive lands 14, in particular when they have been made as in the embodiments illustrated in FIGS. 7 to 9, may be reinforced by using multiple connection wells 11. For example, the connection wells 11 form a sort of grid through which the conductive paste, glue or ink 18 is distributed.

Figure 11:
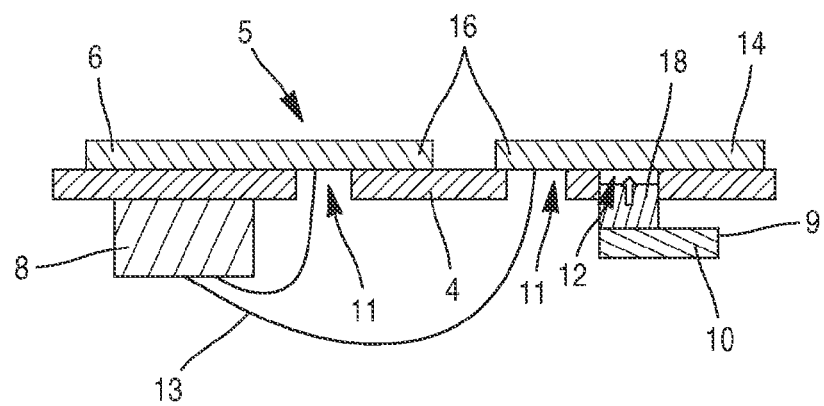

Alternatively, as illustrated in FIG. 11, a blind hole 12 is left empty and without encapsulation resin, so that it may accommodate an antenna 9 end 10 that is provided with a bump of conductive paste 18, and thereby allow connection with the first side of the conductive land 14.

Figure 12:
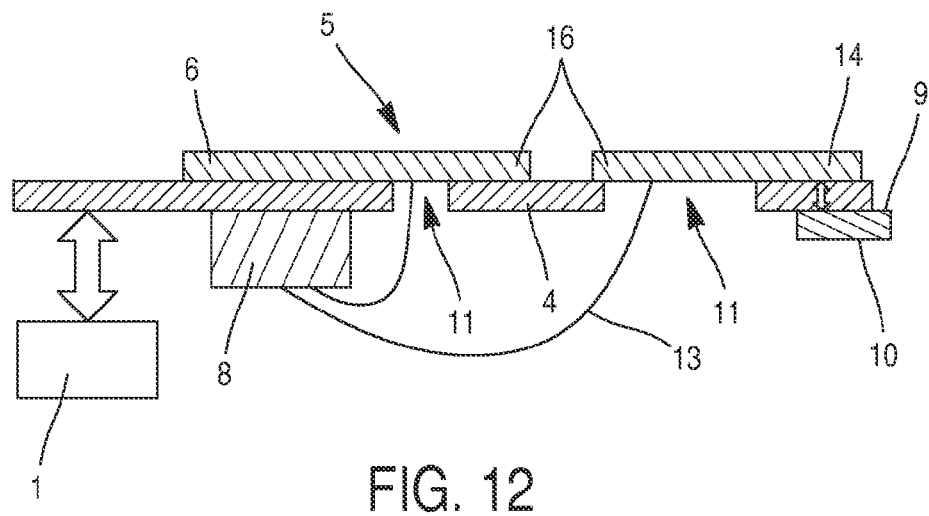

According to the variant illustrated in FIG. 12, a thermally reactivatable adhesive substrate 4 is used that has anisotropic conductive properties. This substrate 4 allows a direct electrical connection (represented by the black arrow) between an antenna 9 end 10 and the first side of the conductive land 14 to be established during the operation of insertion into the card under pressure and heat.

The fact of using a substrate 4 that has thermally reactivatable adhesive properties allows the chip 8 to be directly bonded to the substrate 4, without adding glue as usually used to die-attach chips and the module 2 to the card 1 (see white arrow). Advantageously, the thermally reactivatable adhesive substrate 4 is chosen so that:
  it is available on reels in order to be compatible with a reel-to-reel method;
  it is thermally resistant up to at least 130° C.;
  it is chemically resistant to the solvents, bases and acids used in the methods for chemically etching copper;
  it is chemically resistant to electrolytic metallization baths (nickel, gold, silver, etc.);
  it allows the chip to be bonded with a shear force (in kgf) that is 1.2 times greater than the surface area of the chip (in mm$^2$);
  it allows the conductive wires 13 that connect the chip 8 to the conductive layer 16 to be ultrasonically soldered with a force that is greater than or equal to 3 gf; and
  it allows an adhesion strength of the module 2 to be obtained after bonding to the card 1 with a force that is greater than or equal to 60 N.

The substrates 4 that are compatible with these demands correspond, for example, to the references 844 or 8410 by Tesa®, G185A by Scapa®, HiBond-3 by Carder) or else FB-ML4 by Nitta®. More generally, substrates 4 based on a copolyamide, nitrile-phenolic, polyolefin, polyester, polyurethane, EVA, or epoxy chemistry may be compatible with the invention.

The thermally reactivatable adhesive substrate 4 may be reinforced by woven or unwoven organic (PET) or inorganic (glass) textile fibers in order to improve its mechanical properties during the steps in which it continuously runs. For example, the glass fabrics with the references 1080-Greige or else G106 by Porcher® may be continuously hot-colaminated in order to produce a composite substrate 4 with optimized mechanical properties.

A resin that is available in granular form, hot-coated onto textile fibers by using, for example, slot-die technology, may be used to obtain a thermally reactivatable adhesive substrate 4.

Therefore, by virtue of this type of substrate 4, reinforced or not, the chip 8 may be bonded directly thereto, whereas in the methods of the prior art, a glue had to be distributed in an additional step before integrating the module 2 in the card 1. This is particularly advantageous especially when the steps for producing the module 2 on the one hand, and for integrating the module 2 in a card 1 on the other hand, are carried out by separate operators.

The solution consisting in using an adhesive substrate moreover avoids having, on the one hand, to apply a glue layer coating between a dielectric substrate of glass-epoxy type, for example, and the conductive layer and, on the other hand, to cross-link this glue after laminating the conductive layer onto the substrate.

In addition to its thermally reactivatable adhesive properties, the substrate may have, as pointed out above, anisotropic electrical conduction properties ("ACF" for "anisotropic conductive film"). Substrates having this type of property correspond, for example, to the references HAF 8412 and HAF 8414 by Tesa®, respectively composed of phenolic and copolyamide bodies to ensure the adhesive function and respectively charged with microbeads of glass and of copper that are covered with silver at a density of, for example, $60/mm^2$ to ensure the electrically conductive function along the direction of the thickness of the substrate.

The substrates with anisotropic electrical conduction properties that may be used for the production of circuits according to the invention may also be mechanically reinforced as indicated above.

The fact of giving a single element (the substrate 4) two functions (bonding and electrical connection) allows the modules for a chip card to be miniaturized with respect to modules in which these two functions are carried out by different elements.

The invention claimed is:

1. A method for producing a circuit for a chip card module comprising:
   providing an insulating substrate,
   perforating the insulating substrate in order to form connection wells,
   providing a conductive layer supported by the insulating substrate, with a first side turned toward the insulating substrate and a second side,
   implementing, in the conductive layer, contacts at the level of which
   the second side is configured to establish a connection by electrical contact with a chip card reader, and
   the first side is configured to establish, at the level of connection wells, an electrical connection with an electronic chip,
   wherein at least two conductive lands, that are electrically isolated from the contacts, are also made in the conductive layer, at the level of which lands the first side of the conductive layer at least partially closes up at least one connection well that is configured to connect the electronic chip to an antenna inserted into the body of a chip board, wherein a well for connection with the electronic chip is made in an encapsulation area corresponding to an area covered by a material for protecting the chip and its connections to the contacts and to the conductive lands, and a connection well, outside the encapsulation area, for connecting the antenna to a conductive land, and wherein two wells for connecting the antenna to a conductive land that are located outside the encapsulation area are each respectively essentially located on either side of the encapsulation area such that the two wells are substantially diametrically opposed relative to the encapsulation area.

2. The method as claimed in claim 1, in which the connection of the antenna to the module is made by the same connection wells, that are at least partially closed up by conductive lands, as those serving to connect the chip to the conductive lands.

3. The method as claimed in claim 1, in which the bulk of the module in terms of width is essentially limited to that of three contacts arranged and distributed in a row.

4. The method as claimed in claim 1, in which two rows of three contacts are implemented on a module, each row respectively being located on either side of a central area that is configured to accommodate the electronic chip, and two conductive lands, on either side of this central area.

5. The method as claimed in claim 1, in which contacts distributed in two rows are implemented, the two conductive lands and the central area that is configured to accommodate the electronic chip being distributed in a row that is located between the rows of contacts.

6. The method as claimed in claim 1, in which a connection well that is configured for the connection of the electronic chip to an antenna is made at the level of each of the two conductive lands, the distance between these two connection wells, each being respectively located at the level of a conductive land, being greater than the size of a cavity made in the card in order to accommodate the electronic chip and an encapsulation resin.

7. The method as claimed in claim 1, in which five contacts are made in the conductive layer, each respectively for connecting the ground, the power supply, the input/output, the clock and the reset of an electronic chip, as well as two additional conductive lands.

8. The method as claimed in claim 1, in which an array of connection holes is made at the level of each conductive land.

9. The method as claimed in claim 1, in which the connection wells that are at least partially closed up by the conductive lands have a form that is elongated along a plane parallel to the first and second sides of the conductive layer.

10. The method as claimed in claim 1, in which the insulating substrate comprises an adhesive material.

11. The method as claimed in claim 10, in which the adhesive material is thermally reactivatable.

12. The method as claimed in claim 10, in which the adhesive material has anisotropic electrical properties.

13. The method as claimed in claim 10, in which more than two connection wells are made at the level of at least one conductive land.

14. A flexible electrical circuit for implementing a method for producing a chip card module, this circuit comprising:
   an insulating substrate with connection wells, a conductive layer supported by the insulating substrate, with a first side turned toward the insulating substrate and a second side, with contacts that are formed in this conductive layer, at the level of which contacts the second side is configured to establish a connection by electrical contact with a chip card reader, and the first side is configured to establish, at the level of connection wells, an electrical connection with an electronic chip, wherein the conductive layer also comprises at least two conductive lands, that are electrically isolated from the contacts, at the level of which lands the first side of the conductive layer at least partially closes up at least one connection well that is configured to connect an electronic chip to an antenna inserted in a card body, comprising a well for connection with the electronic chip in an encapsulation area corresponding to an area covered by a material for protecting the chip and its connections to the contacts and to the conductive lands, and a connection well, outside the encapsulation area, for connecting the antenna to a conductive land, and wherein two wells for connecting the antenna to a conductive land that are located outside the encapsulation area are each respectively essentially located on either side of the encapsulation area such that the two wells are substantially diametrically opposed relative to the encapsulation area.

15. The circuit as claimed in claim 14, in which the same connection wells, that are at least partially closed up by conductive lands, as those serving to connect the chip to the conductive lands, serve to the connection between the antenna and the module.

16. The circuit as claimed in claim 14, comprising connection wells that are each at least partially closed up by a conductive land and whose form is elongated along a plane parallel to the first and second sides of the conductive layer.

17. The circuit as claimed in claim 14, in which the bulk of a module in terms of width is limited to that of three contacts arranged and distributed in a row.

18. The circuit as claimed in claim 14, comprising two rows of three contacts, each row respectively being located on either side of a central area that is configured to accommodate the electronic chip (8), and two conductive lands, on either side of this central area.

19. The circuit as claimed in claim 14, comprising a connection well that is configured for the connection of the electronic chip to an antenna at the level of each of the two conductive lands, the distance between these two connection wells, each being respectively located at the level of a conductive land, being greater than the size of a cavity made in the card in order to accommodate the electronic chip and an encapsulation resin.

20. The circuit as claimed in claim 14, comprising five contacts in the conductive layer, each respectively for connecting the ground, the power supply, the input/output, the clock and the reset of an electronic chip, as well as two additional conductive lands for connecting an antenna.

21. The circuit as claimed in claim 14, in which the insulating substrate comprises an adhesive material.

22. The circuit as claimed claim 21, in which the adhesive material is thermally reactivatable.

23. The circuit as claimed in claim 21, in which the adhesive material has anisotropic electrical properties.

* * * * *